United States Patent
Nadkarni et al.

(10) Patent No.: US 9,768,779 B2
(45) Date of Patent: Sep. 19, 2017

(54) VOLTAGE LEVEL SHIFTERS EMPLOYING PRECONDITIONING CIRCUITS, AND RELATED SYSTEMS AND METHODS

(71) Applicant: QUALCOMM Incorporated, San Diego, CA (US)

(72) Inventors: Rahul Krishnakumar Nadkarni, Cary, NC (US); Stephen Edward Liles, Apex, NC (US); Manish Garg, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/731,747

(22) Filed: Jun. 5, 2015

(65) Prior Publication Data

US 2016/0359487 A1 Dec. 8, 2016

(51) Int. Cl.
| | |
|---|---|
| *H03K 19/173* | (2006.01) |
| *H03K 19/094* | (2006.01) |
| *H03K 19/0185* | (2006.01) |
| *H03K 3/012* | (2006.01) |
| *H03K 3/356* | (2006.01) |

(52) U.S. Cl.
CPC ..... *H03K 19/018521* (2013.01); *H03K 3/012* (2013.01); *H03K 3/356165* (2013.01)

(58) Field of Classification Search
CPC .............. H03K 19/018521; H03K 19/018507
USPC ......................... 326/81, 68, 83, 112; 327/215
See application file for complete search history.

(56) References Cited

U.S. PATENT DOCUMENTS

| | | | |
|---|---|---|---|
| 5,684,410 A | 11/1997 | Guo | |
| 5,818,280 A | 10/1998 | Martin | |
| 6,853,234 B2 * | 2/2005 | Bucossi | H03K 3/012 326/62 |
| 6,888,394 B2 * | 5/2005 | Cleary | H03K 3/356165 326/68 |
| 7,554,360 B1 | 6/2009 | Jiang | |
| 7,609,090 B2 | 10/2009 | Srivastava et al. | |
| (Continued) | | | |

OTHER PUBLICATIONS

International Search Report and Written Opinion for PCT/US2016/031981, mailed Jul. 28, 2016, 17 pages.
(Continued)

*Primary Examiner* — Daniel D Chang
(74) *Attorney, Agent, or Firm* — W&T/Qualcomm

(57) ABSTRACT

Voltage level shifters employing preconditioning circuits are disclosed. Related systems and methods are also disclosed. In one aspect, voltage level shifter is configured to generate a voltage level shifted non-complement output signal and complement output signal corresponding to non-complement input signal and complement input signal, respectively. First pull-up circuit is configured to generate complement output signal in response to non-complement input signal transitioning to logic low voltage. First pull-down circuit is configured to generate non-complement output signal in response to complement input signal transitioning to logic high voltage. First preconditioning circuit is configured to receive non-complement and complement output signals and generate and provide shifted voltage signal to complement output in response to non-complement output signal transitioning to logic low voltage. This allows the complement output signal to transition to the shifted voltage more quickly.

27 Claims, 5 Drawing Sheets

(56) References Cited

U.S. PATENT DOCUMENTS

| | | | |
|---|---|---|---|
| 7,884,644 B1* | 2/2011 | Wu | H03K 3/017 |
| | | | 326/68 |
| 7,977,984 B1 | 7/2011 | D'Souza et al. | |
| 8,610,462 B1 | 12/2013 | Wang et al. | |
| 8,653,852 B2 | 2/2014 | Lin et al. | |
| 2002/0097606 A1 | 7/2002 | Kurokawa et al. | |
| 2007/0164789 A1 | 7/2007 | Panjwani et al. | |
| 2015/0042393 A1 | 2/2015 | Chen et al. | |

OTHER PUBLICATIONS

Second Written Opinion for PCT/US2016/031981, dated May 4, 2017, 12 pages.

* cited by examiner

VOLTAGE LEVEL SHIFTERS EMPLOYING PRECONDITIONING CIRCUITS, AND RELATED SYSTEMS AND METHODS

BACKGROUND

I. Field of the Disclosure

The technology of the disclosure relates generally to voltage level shifters for shifting signals in one voltage domain to another voltage domain, and particularly to reducing transition times of shifting such signals in voltage level shifters.

II. Background

Processor-based systems have access to a power supply that provides voltage for powering operations. Particular components within a processor-based system may operate while using less voltage as compared to other components within the same system. For example, a processor may use less voltage to operate during idle modes. On the other hand, memory may indicate a certain minimum voltage to retain data, regardless of the processor's mode of operation. In this regard, rather than providing a single voltage supply to supply a voltage to all components in a processor-based system equally, more than one voltage supply may supply voltage to components of the processor-based system. Components that can operate at a lower voltage are powered by a lower voltage supply in a first voltage domain, while components that can operate at a higher voltage are powered by a higher voltage supply in a second voltage domain. In this manner, power is conserved as opposed to providing a single higher voltage to all components.

However, so that signals from components in one voltage domain operating from a first voltage supply can be compatibly provided and processed by components operating from a second voltage supply in another voltage domain, voltage level shifters are employed. Voltage level shifters shift signals from a first voltage domain to a second voltage domain, or vice versa. For example, voltage level shifters can shift a logic high ('1') voltage in the first voltage domain (e.g., 0.5 V) to a logic high ('1') voltage in the second voltage domain (e.g., 1.0 V).

Notably, as the difference in supply voltages in the second voltage domain and the first voltage domain increases, components within a voltage level shifter must be configured so as to prevent concurrent activation of certain components. For example, as the difference in supply voltages in the first and second voltage domains increases, an input signal in the first voltage domain may concurrently activate a pull-down circuit and a pull-up circuit in a voltage level shifter. To prevent such concurrent activation of the pull-down and pull-up circuits, the pull-down circuit can be configured to be stronger than the pull-up circuit at driving the output. Conventionally, in order to configure the pull-down circuit to be stronger than the pull-up circuit at driving the output, the pull-down circuit may be designed with a larger size, thus resulting in an increase of overall area of the voltage level shifter. It would be advantageous to provide a voltage level shifter to prevent concurrent activation of components as the difference in supply voltages of the first and second voltage domains increases while mitigating or eliminating increase in area.

SUMMARY OF THE DISCLOSURE

Aspects disclosed in the detailed description include voltage level shifters employing preconditioning circuits. Related systems and methods are also disclosed. In one aspect, a first pull-down circuit is configured to generate and provide a non-complement output signal to a non-complement output in response to a complement input signal transitioning to a logic high voltage in a first voltage domain. Further, a first pull-up circuit is configured to generate and provide a complement output signal to a complement output in response to a non-complement input signal transitioning to a logic low voltage in the first voltage domain. A preconditioning circuit is configured to receive the non-complement output signal and the complement output signal, and generate and provide the shifted voltage signal to the complement output in response to the non-complement output signal transitioning to a logic low voltage. Because the preconditioning circuit provides the shifted voltage signal to the complement output, the complement output signal transitions to the shifted voltage more quickly. Therefore, the preconditioning circuit enables the complement output signal to transition to the shifted voltage at a faster transition rate.

In one aspect, a voltage level shifter is disclosed. The voltage level shifter comprises a first pull-up circuit. The first pull-up circuit comprises a first input configured to receive a non-complement input signal. The first pull-up circuit further comprises a second input configured to receive a non-complement output signal. The first pull-up circuit is configured to generate a complement output signal on a first pull-up output coupled to a complement output. The voltage level shifter further comprises a first pull-down circuit. The first pull-down circuit comprises a first input configured to receive a complement input signal. The first pull-down circuit is configured to generate the non-complement output signal comprising a ground voltage signal on a first pull-down output coupled to a non-complement output. The voltage level shifter further comprises a first preconditioning circuit. The first preconditioning circuit comprises a first input configured to receive the non-complement output signal. The first preconditioning circuit further comprises a second input configured to receive the complement output signal. The first preconditioning circuit is configured to generate a shifted voltage signal of the complement input signal on a first preconditioning output directly coupled to the complement output in response to the non-complement output signal transitioning to a logic low voltage.

In another aspect, a voltage level shifter is disclosed. The voltage level shifter comprises a means for generating a complement output signal on a first pull-up output coupled to a complement output. The voltage level shifter further comprises a means for generating a non-complement output signal comprising a ground voltage signal on a first pull-down output coupled to a non-complement output. The voltage level shifter further comprises a means for generating a shifted voltage signal of a complement input signal on a first preconditioning output directly coupled to the complement output in response to the non-complement output signal on the non-complement output transitioning to a logic low voltage.

In another aspect, a method for increasing an output transition rate of a voltage level shifter is disclosed. The method comprises generating a shifted voltage signal of a complement input signal on a first pull-up output coupled to a complement output in response to a non-complement input signal transitioning to a logic low voltage. The method further comprises generating a ground voltage signal on a first pull-down output coupled to a non-complement output in response to the complement input signal transitioning to a logic high voltage. The method further comprises generating the shifted voltage signal of the complement input signal on the complement output in response to a non-complement output signal on the non-complement output transitioning to a logic low voltage without using a complement output signal from the complement output to activate a first pull-down circuit.

DETAILED DESCRIPTION

Figure 1A:
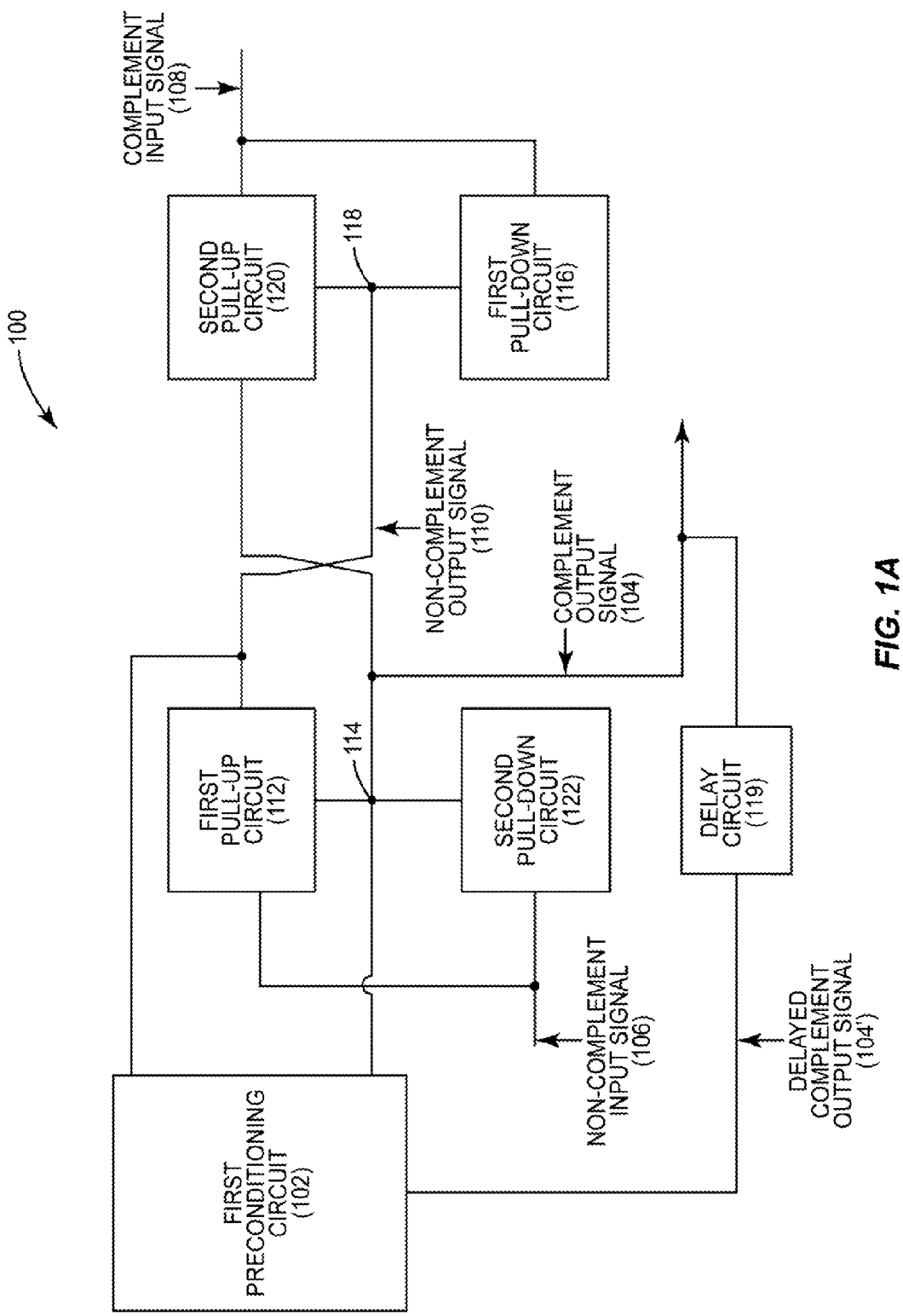
FIG. 1A is a block diagram of an exemplary voltage level shifter that includes a preconditioning circuit configured to generate and provide a shifted voltage signal to a complement output of the voltage level shifter.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

FIG. 1A illustrates an exemplary voltage level shifter 100 employing a preconditioning circuit 102, wherein the voltage level shifter 100 is based on a complementary signal design. As described in more detail below, in this example, the preconditioning circuit 102 is configured to generate a shifted voltage signal that causes a complement output signal 104 to transition to a logic high ('1') voltage more quickly, thus increasing performance of the voltage level shifter 100. In other words, when the preconditioning circuit 102 is not employed, the complement output signal 104 transitions to the shifted voltage signal at a relatively slower rate, thus limiting the performance of the voltage level shifter 100. Employing the preconditioning circuit 102 to cause the complement output signal 104 to transition more quickly may improve the performance of the voltage level shifter 100. This rate of transition is increased even as the difference between the supply voltages in first and second voltage domains increases.

With continuing reference to FIG. 1A, the voltage level shifter 100 is configured to receive a non-complement input signal 106 and a complement input signal 108 from a first voltage domain. The voltage level shifter 100 is further configured to generate a non-complement output signal 110 and the complement output signal 104 corresponding to the non-complement input signal 106 and the complement input signal 108, respectively, shifted into a second voltage domain. To generate such output signals 104, 110, a first pull-up circuit 112 is configured to generate and provide a shifted voltage signal of the complement input signal 108 to a complement output 114 in response to the non-complement input signal 106 transitioning to a logic low ('0') voltage. Further, a first pull-down circuit 116 is configured to generate and provide a ground voltage signal to a non-complement output 118 in response to the complement input signal 108 transitioning to a logic high ('1') voltage. As discussed in more detail below, generating the ground voltage signal on the non-complement output 118 only includes one stage of execution in the voltage level shifter 100, making it a "fast edge" transition. However, generating the shifted voltage signal on the complement output 114 includes two stages of execution in the voltage level shifter 100, making it a "slow edge" transition.

With continuing reference to FIG. 1A, the first preconditioning circuit 102 is configured to receive the non-complement output signal 110 and a delayed complement output signal 104' and generate and provide the shifted voltage signal to the complement output 114 in response to the non-complement output signal 110 transitioning to a logic low ('0') voltage. Notably, in this aspect, the delayed complement output signal 104' is a delayed version of the complement output signal 104 generated by a delay circuit 119. Further, the delay circuit 119 is an optional element, wherein alternative aspects may provide the complement output signal 104 directly to the preconditioning circuit 102. By configuring the preconditioning circuit 102 to generate the shifted voltage signal on the complement output 114, the complement output signal 104 transitions to the shifted voltage more quickly. In other words, in order to compensate for the "slow edge" transition of the complement output signal 104, the preconditioning circuit 102 is configured to generate and provide the shifted voltage signal to the complement output 114. Therefore, the voltage level shifter 100 may achieve an increased performance as the preconditioning circuit 102 causes the complement output signal 104 to transition to the shifted voltage at a faster transition rate. This rate of transition is increased even as the difference between the supply voltages in first and second voltage domains increases.

In addition to the first pull-up circuit 112 and the first pull-down circuit 116, the voltage level shifter 100 in FIG. 1A employs circuitry configured to generate signals on the complement output 114 and the non-complement output 118 in response to the non-complement input signal 106 transitioning to a logic high ('1') voltage and the complement input signal 108 transitioning to a logic low ('0') voltage. Thus, the voltage level shifter 100 also employs a second pull-up circuit 120 and a second pull-down circuit 122. The second pull-up circuit 120 is configured to generate and provide a shifted voltage signal of the non-complement input signal 106 to the non-complement output 118 in response to the complement input signal 108 transitioning to a logic low ('0') voltage. Further, the second pull-down circuit 122 is configured to generate and provide the ground voltage signal to the complement output 114 in response to the non-complement input signal 106 transitioning to a logic high ('1') voltage. Therefore, by employing the first pull-up circuit 112, the first pull-down circuit 116, the second pull-up circuit 120, and the second pull-down circuit 122, the voltage level shifter 100 is configured to provide shifted voltage values to the non-complement output 118 and the complement output 114 in response to the non-complement input signal 106 and the complement input signal 108, respectively, having either a logic high ('1') or logic low ('0') voltage. Additionally, by employing the preconditioning circuit 102 in conjunction with the circuits 112, 116, 120, and 122, the voltage level shifter 100 may achieve an increased performance, as the complement output signal 104 transitions more quickly to the shifted voltage.

Figure 1B:
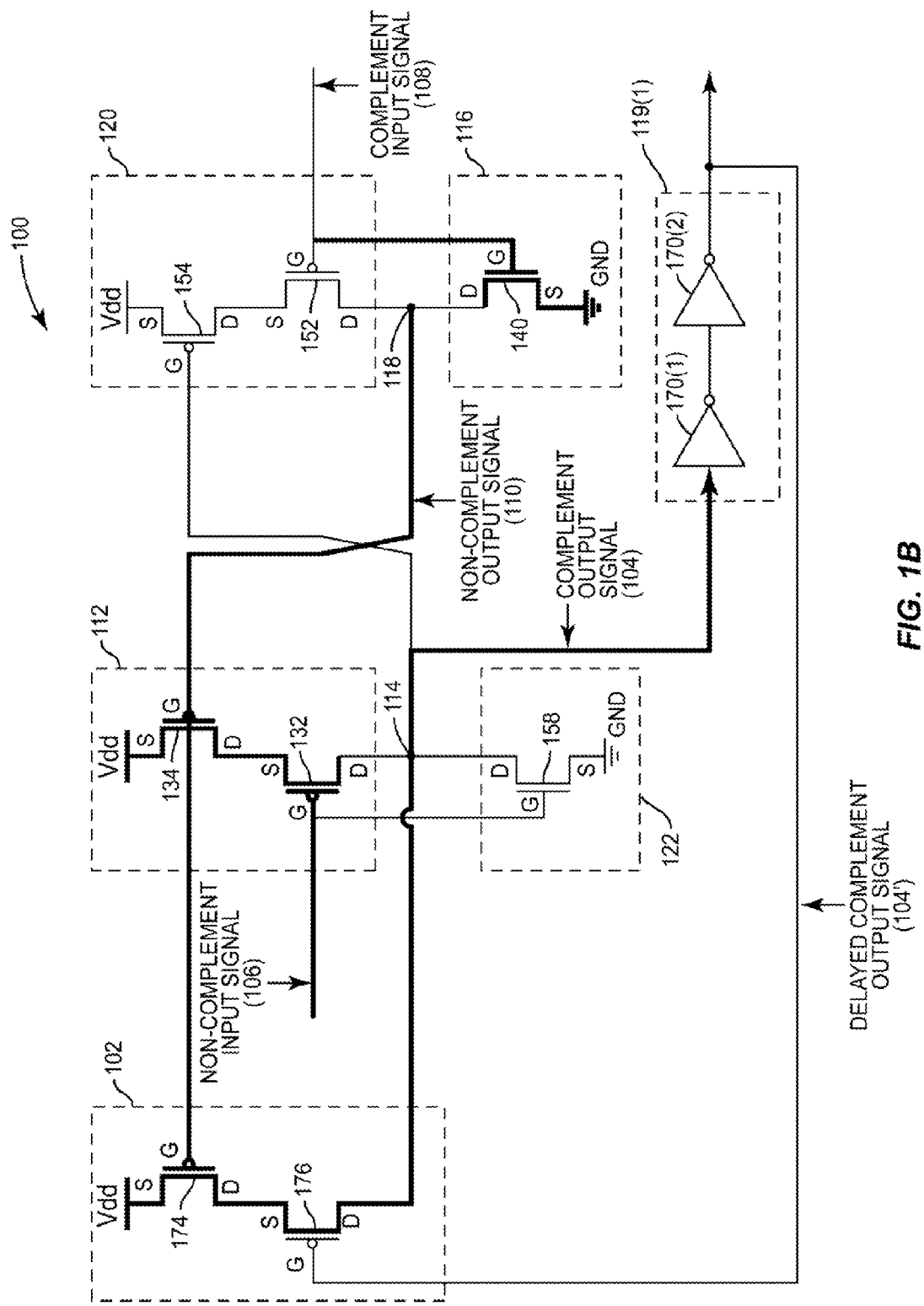
FIG. 1B is an exemplary circuit diagram of the voltage level shifter of FIG. 1A illustrating a highlighted path that demonstrates how the preconditioning circuit generates and provides a shifted voltage signal to the complement output of the voltage level shifter.

In this regard, FIG. 1B illustrates a more detailed exemplary version of the voltage level shifter 100 in FIG. 1A. The first pull-up circuit 112 includes a first input configured to receive the non-complement input signal 106 and a second input configured to receive the non-complement output signal 110. In this aspect, the second input is configured to receive the non-complement output signal 110 from a first pull-down output of the first pull-down circuit 116, wherein the second input and the first pull-down output are both coupled to the non-complement output 118. Further, the first pull-up circuit 112 is configured to generate the shifted voltage signal of the complement input signal 108 on a first pull-up output coupled to the complement output 114. In this aspect, the first pull-up circuit 112 is configured to generate such a signal by employing a first p-type metal-oxide semiconductor (PMOS) transistor 132 and a second PMOS transistor 134. A gate (G) of the first PMOS transistor 132 is configured to receive the non-complement input signal 106 from the first input, while a drain (D) is coupled to the first pull-up output. Further, a source (S) of the first PMOS transistor 132 is coupled to a drain (D) of the second PMOS transistor 134. A gate (G) of the second PMOS transistor 134 is coupled to the non-complement output 118, and a source (S) of the second PMOS transistor 134 is coupled to a voltage supply Vdd. In this aspect, the voltage supply Vdd is configured to provide a supply voltage of the second voltage domain. Thus, the first and second PMOS transistors 132, 134 are activated in response to the non-complement input signal 106 and the non-complement output signal 110, respectively, having a logic low ('0') voltage. In response to the first and second PMOS transistors 132, 134 both activating, the voltage supply Vdd generates a high voltage signal on the first pull-up output, which is coupled to the complement output 114.

With continuing reference to FIG. 1B, the first pull-down circuit 116 in this aspect includes a first input configured to receive the complement input signal 108. The first pull-down circuit 116 is configured to generate the ground voltage signal on the first pull-down output coupled to the non-complement output 118. In this aspect, the first pull-down circuit 116 is configured to generate such a signal by employing an n-type MOS (NMOS) transistor 140. A gate (G) of the NMOS transistor 140 is configured to receive the complement input signal 108. A drain (D) of the NMOS transistor 140 is coupled to the first pull-down output, which is coupled to the non-complement output 118, and a source (S) of the NMOS transistor 140 is coupled to a ground voltage source GND. Thus, the NMOS transistor 140 is activated in response to the complement input signal 108 having a logic high ('1') voltage. In response to the NMOS transistor 140 activating, the ground voltage source GND generates a ground voltage signal on the first pull-down output, which is coupled to the non-complement output 118. Notably, in aspects described herein, the first and second voltage domains may share the ground voltage source GND so that each voltage domain has a common ground, or the first voltage domain may employ a non-shared ground voltage source (not shown) separate from the ground voltage source GND.

With continuing reference to FIG. 1B, the second pull-up circuit 120 includes a first input configured to receive the complement input signal 108 and a second input configured to receive the complement output signal 104. In this aspect, the second input is configured to receive the complement output signal 104 from a second pull-down output of the second pull-down circuit 122, wherein the second input and the second pull-down output are both coupled to the complement output 114. Further, the second pull-up circuit 120 is configured to generate the shifted voltage signal of the non-complement input signal 106 on a second pull-up output coupled to the non-complement output 118. In this aspect, the second pull-up circuit 120 is configured to generate such a signal by employing a first PMOS transistor 152 and a second PMOS transistor 154. A gate (G) of the first PMOS transistor 152 is configured to receive the complement input signal 108 from the first input, while a drain (D) is coupled to the second pull-up output. Further, a source (S) of the first PMOS transistor 152 is coupled to a drain (D) of the second PMOS transistor 154. A gate (G) of the second PMOS transistor 154 is coupled to the complement output 114 and a source (S) of the second PMOS transistor 154 is coupled to the voltage supply Vdd. Thus, the first and second PMOS transistors 152, 154 are activated in response to the complement input signal 108 and the complement output signal 104, respectively, having a logic low ('0') voltage. In response to the first and second PMOS transistors 152, 154 both activating, the voltage supply Vdd generates a logic high ('1') voltage signal on the second pull-up output, which is coupled to the non-complement output 118.

With continuing reference to FIG. 1B, the second pull-down circuit 122 in this aspect includes a first input configured to receive the non-complement input signal 106. The second pull-down circuit 122 is configured to generate the ground voltage signal on the second pull-down output, which is coupled to the complement output 114. In this aspect, the second pull-down circuit 122 is configured to generate such a signal by employing an NMOS transistor 158. A gate (G) of the NMOS transistor 158 is configured to receive the non-complement input signal 106. A drain (D) of the NMOS transistor 158 is coupled to the second pull-down output, and a source (S) of the NMOS transistor 158 is coupled to the ground voltage source GND. Thus, the NMOS transistor 158 is activated in response to the non-complement input signal 106 having a logic high ('1') voltage. In response to the NMOS transistor 158 activating, the ground voltage source GND generates a ground voltage signal on the second pull-down output, which is coupled to the complement output 114.

With continuing reference to FIG. 1B, the preconditioning circuit 102 in this aspect includes a first input coupled to the non-complement output 118 and configured to receive the non-complement output signal 110. The preconditioning circuit 102 also includes a second input configured to receive the complement output signal 104 originating from the complement output 114. In this aspect, the delay circuit 119(1) is employed to delay the complement output signal 104 so that the transition of the complement output signal 104 is communicated to the preconditioning circuit 102 only after a defined delay (i.e., so that the preconditioning circuit 102 receives a delayed complement output signal 104', which is a delayed version of the complement output signal 104). To achieve this functionality, an input of the delay circuit 119(1) is coupled to the complement output 114, while a delay output of the delay circuit 119(1) is coupled to the second input of the preconditioning circuit 102. While the delay circuit 119(1) in this aspect includes inverters 170(1)-170(2), the delay circuit 119(1) in other aspects may include alternative circuit elements. Notably, other aspects may achieve similar functionality without the delay circuit 119(1).

With continuing reference to FIG. 1B, the first preconditioning circuit 102 is configured to generate the shifted voltage signal of the complement input signal 108 on a preconditioning output of the preconditioning circuit 102 directly coupled to the complement output 114. As described in more detail below, such a signal is generated in response to the non-complement output signal 110 transitioning to a logic low ('0') voltage. In this aspect, the preconditioning circuit 102 is configured to generate the shifted voltage signal by employing a first PMOS transistor 174 and a second PMOS transistor 176. A gate (G) of the first PMOS transistor 174 is coupled to the non-complement output 118. A source (S) of the first PMOS transistor 174 is coupled to the voltage supply Vdd, and a drain (D) of the first PMOS transistor 174 is coupled to a source (S) of the second PMOS transistor 176. Additionally, a gate (G) of the second PMOS transistor 176 is configured to receive the delayed complement output signal 104', while a drain (D) of the second PMOS transistor 176 is coupled to the preconditioning output of the preconditioning circuit 102, which is directly coupled to the complement output 114. Notably, other aspects may configure the gate (G) of the second PMOS transistor 176 to receive the complement output signal 104 rather than the delayed complement output signal 104' and achieve similar functionality.

As an illustrative example, FIG. 1B includes a highlighted path illustrating how the first preconditioning circuit 102 generates and provides a shifted voltage signal to the complement output 114 so that the complement output signal 104 transitions to a logic high ('1') voltage more quickly. In this example, it is assumed that the non-complement input signal 106 has recently transitioned to a logic low ('0') voltage in the first voltage domain (e.g., 0 V) and the complement input signal 108 has recently transitioned to a logic high ('1') voltage in the first voltage domain (e.g., 0.5 V). In response to such transitions, the complement input signal 108 activates the NMOS transistor 140 in the first pull-down circuit 116. Thus, the first pull-down circuit 116 generates and provides the ground voltage signal to the non-complement output 118, causing the non-complement output signal 110 to have a logic low ('0') voltage in the second voltage domain (e.g., 0 V). Notably, generating and providing the ground voltage signal to the non-complement output 118 includes one stage of execution in the voltage level shifter 100 (i.e., activation of the first pull-down circuit 116). Thus, generating the ground voltage signal on the non-complement output 118 is referred to as a "fast edge" transition.

With continuing reference to FIG. 1B, the non-complement output signal 110 is provided from the non-complement output 118 to the second PMOS transistor 134 of the first pull-up circuit 112. Because the non-complement output signal 110 has the logic low ('0') voltage (e.g., 0 V) from the first pull-down circuit 116, the non-complement output signal 110 activates the second PMOS transistor 134. Further, because the non-complement input signal 106 previously transitioned to the logic low ('0') voltage (e.g, 0 V), the non-complement input signal 106 activates the first PMOS transistor 132 in the first pull-up circuit 112. In response to the first and second PMOS transistors 132, 134 activating, the first pull-up circuit 112 provides the shifted voltage signal from the voltage supply Vdd to the complement output 114. Notably, generating the shifted voltage signal on the complement output 114 includes two stages of execution in the voltage level shifter 100 (i.e., activation of the first pull-down circuit 116 and activation of the first pull-up circuit 112). Thus, generating the shifted voltage signal on the complement output 114 is referred to as a "slow edge" transition. Further, the complement output signal 104 does not transition to the shifted voltage signal instantaneously in response to the first PMOS transistor 132 activating. Such a delay in transition of the complement output signal 104 is attributable to the configuration of the first and second PMOS transistors 132, 134 with reference to the NMOS transistor 158.

With continuing reference to FIG. 1B, for the voltage level shifter 100 to operate as previously described, the combination of the first and second PMOS transistors 132, 134 of the first pull-up circuit 112 is configured to be weaker than the NMOS transistor 158 of the second pull-down circuit 122. Such a configuration is employed because as the difference between the supply voltages of the first and second voltage domain increases, it is more likely that a logic high ('1') voltage on the non-complement input signal 106 may simultaneously activate the first PMOS transistor 132 and the NMOS transistor 158. This is true because upon the non-complement input signal 106 transitioning from a logic low ('0') voltage to a logic high ('1') voltage, the complement input signal 108 transitions from a logic high ('1') voltage to a logic low ('0') voltage. In response to the non-complement input signal 106 transitioning to a logic high ('1') voltage, a voltage is provided to the gate (G) of the first PMOS transistor 132 (e.g., 0.5 V). However, in response to the complement input signal 108 transitioning to a logic low ('0') voltage, the second PMOS transistor 134 is not immediately deactivated. Rather, the second PMOS transistor 134 is deactivated only after a logic high ('1') voltage is propagated from the second pull-up circuit 120 to the second PMOS transistor 134 in response to the complement input signal 108 transitioning to a logic low ('0') voltage. In the time used to deactivate the second PMOS transistor 134, a logic high ('1') voltage is provided from the voltage supply Vdd (e.g., 1.0 V) to the source (S) of the first PMOS transistor 132.

With continuing reference to FIG. 1B, a gate-source voltage (Vgs) present at the first PMOS transistor 132 when the non-complement input signal 106 has a logic high ('1') voltage may equal a logic high ('1') voltage in the first voltage domain (e.g., 0.5 V) minus a logic high ('1') voltage in the second voltage domain (e.g., 1.0 V) (Vgs=0.5 V−1.0 V=−0.5 V). Such a voltage may be low enough to activate the first PMOS transistor 132. Thus, the combination of the first and second PMOS transistors 132, 134 is configured to be weaker than the NMOS transistor 158 so that the non-complement input signal 106 does not activate the first PMOS transistor 132 and the NMOS transistor 158 simultaneously. As non-limiting examples, the combination of the first and second PMOS transistors 132, 134 may be configured to be weaker than the NMOS transistor 158 by configuring each of the first and second PMOS transistors 132, 134 to have a longer gate length, a shorter gate width, and/or a higher threshold voltage ($V_t$) as compared to that of the NMOS transistor 158. Notably, such configurations of the first and second PMOS transistors 132, 134 increase the time for the complement output signal 104 to transition to the shifted voltage signal. Further, the first and second PMOS transistors 152, 154 of the second pull-up circuit 120 may be similarly configured as compared to the NMOS transistor 140 of the first pull-down circuit 116.

With continuing reference to FIG. 1B, to overcome this increase in transition time, the first preconditioning circuit 102 generates and provides the shifted voltage signal to the complement output 114 in response to the non-complement output signal 110 transitioning to the logic low ('0') voltage. In this aspect, the first PMOS transistor 174 in the preconditioning circuit 102 is activated by the logic low ('0')

voltage (e.g., 0 V) of the non-complement output signal 110. Further, because the complement output signal 104 does not instantaneously transition to a logic high ('1') voltage as previously described, the complement output signal 104 provides a logic low ('0') voltage to the second PMOS transistor 176 of the preconditioning circuit 102 for a particular amount of time after the complement input signal 108 transitions to a logic high ('1') voltage. In other words, the second input of the preconditioning circuit 102 is preconditioned to activate the second PMOS transistor 176. Additionally, as previously described, the delay circuit 119 (1) in this aspect further delays the transition of the complement output signal 104 from being communicated to the preconditioning circuit 102. Thus, during this time the non-complement output signal 110 activates the first PMOS transistor 174 while the delayed complement output signal 104' activates the second PMOS transistor 176. While the first and second PMOS transistors 174, 176 are both activated, the voltage supply Vdd provides the shifted voltage signal to the preconditioning output of the preconditioning circuit 102, which is directly coupled to the complement output 114 in this aspect. By configuring the preconditioning circuit 102 to generate and provide the shifted voltage signal to the complement output 114, the complement output signal 104 transitions to the shifted voltage more quickly. Therefore, the voltage level shifter 100 may have an increased performance, as the preconditioning circuit 102 causes the complement output signal 104 to transition to the shifted voltage at a faster transition rate.

Figure 2:
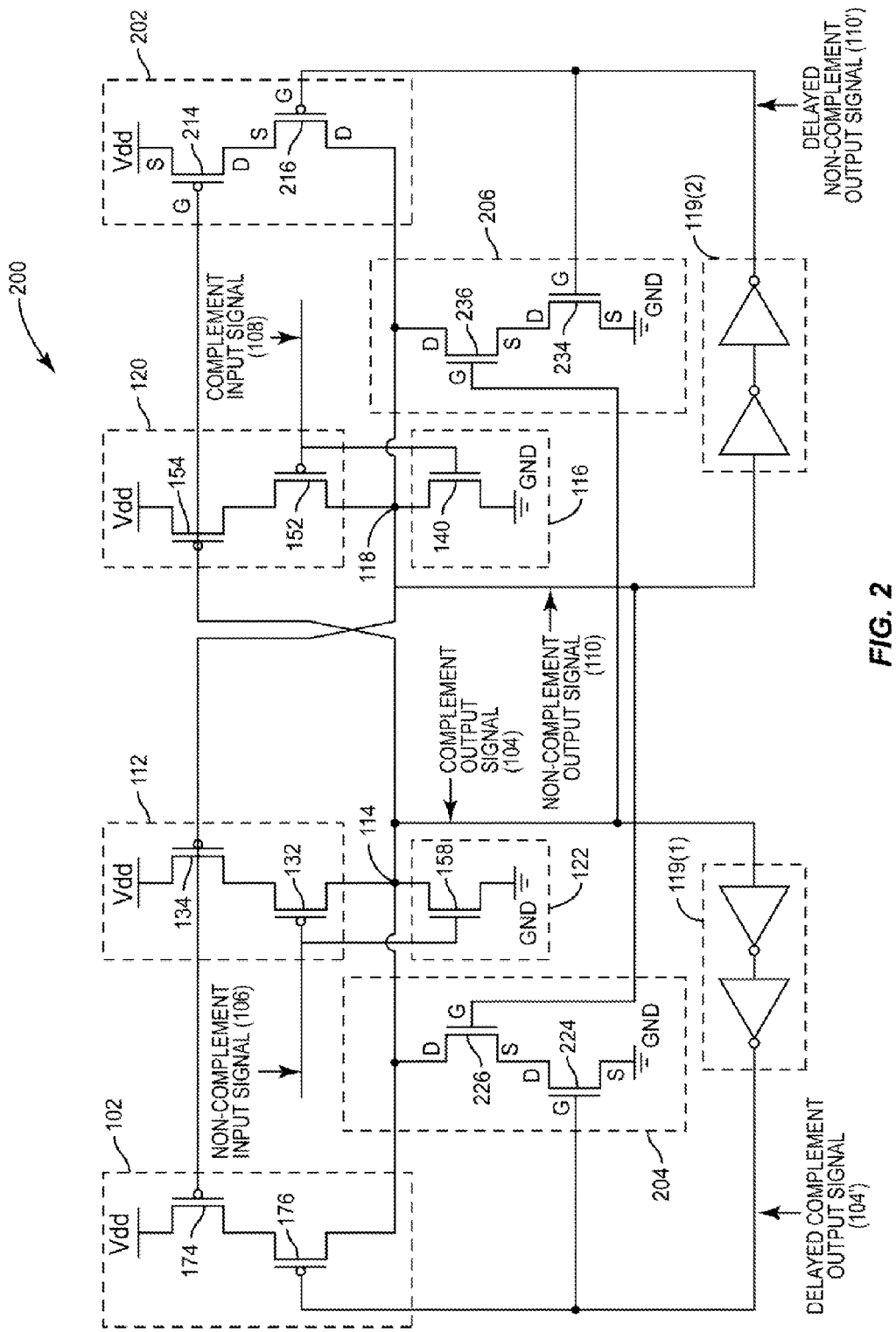
FIG. 2 is a an exemplary circuit diagram of an exemplary voltage level shifter that includes multiple preconditioning circuits, each configured to generate and provide a shifted voltage signal to the complement output and a non-complement output.

In addition to the preconditioning circuit 102 illustrated in FIG. 1B, voltage level shifters may include additional preconditioning circuits so as to reduce other output transition times. In this regard, FIG. 2 illustrates an exemplary voltage level shifter 200 that includes a preconditioning circuit 202, a preconditioning circuit 204, and a preconditioning circuit 206 in addition to the preconditioning circuit 102. The voltage level shifter 200 includes certain common components and circuits with the voltage level shifter 100 in FIG. 1B, which are shown with common element numbers between FIGS. 1B and 2.

With continuing reference to FIG. 2, the preconditioning circuit 202 is similar to the preconditioning circuit 102. However, rather than affecting the transition rate of the complement output signal 104, the preconditioning circuit 202 is configured to increase the rate at which the non-complement output signal 110 transitions to a logic high ('1') voltage. Notably, such an increase is beneficial because similar to the first and second PMOS transistors 132, 134 and the NMOS transistor 158, the combination of the first and second PMOS transistors 152, 154 of the second pull-up circuit 120 are configured to be weaker than the NMOS transistor 140 of the first pull-down circuit 116. In this aspect, the preconditioning circuit 202 is configured to generate the shifted voltage signal of the non-complement input signal 106 on a preconditioning output of the preconditioning circuit 202 directly coupled to the non-complement output 118. The preconditioning circuit 202 in this aspect includes a first input configured to receive the non-complement output signal 110 originating from the non-complement output 118, and a second input coupled to the complement output 114 and configured to receive the complement output signal 104. In this aspect, a delay circuit 119(2), similar to the delay circuit 119(1), is employed to delay the non-complement output signal 110 so that the transition of the non-complement output signal 110 is communicated to the preconditioning circuit 202 only after a defined delay (i.e., so that the preconditioning circuit 202 receives a delayed non-complement output signal 110', which is a delayed version of the non-complement output signal 110). Notably, other aspects may achieve similar functionality without the delay circuit 119(2).

With continuing reference to FIG. 2, as a non-limiting example, it is assumed that the non-complement input signal 106 has recently transitioned to a logic high ('1') voltage in the first voltage domain (e.g., 0.5 V) and the complement input signal 108 has recently transitioned to a logic low ('0') voltage in the first voltage domain (e.g., 0 V). The second pull-down circuit 122 generates and provides the ground voltage signal to the complement output 114, causing the complement output signal 104 to have a logic low ('0') voltage in the second voltage domain (e.g., 0 V). The second pull-up circuit 120 generates and provides the shifted voltage signal to the non-complement output 118, causing the non-complement output signal 110 to transition to a logic high ('1') voltage in the second voltage domain (e.g., 1.0 V). However, similar to other transitions previously described, such a transition is not instantaneous. To increase the rate at which the non-complement output signal 110 transitions to the logic high (T) voltage in the second voltage domain (e.g., 1.0 V), the preconditioning circuit 202 generates and provides the shifted voltage signal to the non-complement output 118 in response to the complement output signal 104 transitioning to a logic low ('0') voltage (e.g., 0 V). By configuring the preconditioning circuit 202 in this manner, the non-complement output signal 110 transitions to the shifted voltage more quickly. Therefore, the voltage level shifter 200 may achieve an increased performance as the preconditioning circuit 202 causes the non-complement output signal 110 to transition to the shifted voltage at a faster transition rate.

With continuing reference to FIG. 2, in this aspect, the preconditioning circuit 202 is configured to generate the shifted voltage signal by employing a first PMOS transistor 214 and a second PMOS transistor 216. A gate (G) of the first PMOS transistor 214 is coupled to the complement output 114. A source (S) of the first PMOS transistor 214 is coupled to the voltage supply Vdd, and a drain (D) of the first PMOS transistor 214 is coupled to a source (S) of the second PMOS transistor 216. Additionally, a gate (G) of the second PMOS transistor 216 is configured to receive the delayed non-complement output signal 110', while a drain (D) of the second PMOS transistor 216 is coupled directly to the preconditioning output of the preconditioning circuit 202. Thus, similar to the preconditioning circuit 102, the first input of the preconditioning circuit 202 is preconditioned to activate the second PMOS transistor 216. Notably, other aspects may configure the gate (G) of the second PMOS transistor 216 to receive the non-complement output signal 110 rather than the delayed non-complement output signal 110' and achieve similar functionality.

Notably, in this aspect, the preconditioning circuits 102, 202 are configured to operate at a higher performance level as compared to the first pull-up circuit 112 and the second pull-up circuit 120, respectively. In other words, the combination of the first and second PMOS transistors 174, 176, and 214, 216 of the preconditioning circuits 102, 202, respectively, are configured to be stronger and faster than the first and second PMOS transistors 132, 134 and 152, 154, respectively. Such a configuration enables the preconditioning circuits 102, 202 to affect the transition time of the complement and non-complement output signals 104, 110, respectively, by allowing the preconditioning circuits 102, 202 to operate faster than the first and second pull-up circuits 112, 120, respectively. Thus, in this aspect the first and second PMOS transistors 174, 176 of the preconditioning circuit 102 are configured to have a shorter gate length, a longer gate width, and/or a lower threshold voltage ($V_t$) as compared to the first and second PMOS transistors 132, 134 in the first pull-up circuit 112. Further, the first and second PMOS transistors 214, 216 of the preconditioning circuit 202 are configured to have a shorter gate length, a longer gate width, and/or a lower threshold voltage ($V_t$) as compared to the first and second PMOS transistors 152, 154 in the second pull-up circuit 120.

With continuing reference the FIG. 2, rather than affecting the rate at which the complement output signal 104 transitions to a logic high ('1') voltage, the preconditioning circuit 204 is configured to increase the rate at which the complement output signal 104 transitions to a logic low ('0') voltage. In this aspect, the preconditioning circuit 204 is configured to generate the ground voltage signal on a preconditioning output of the preconditioning circuit 204 directly coupled to the complement output 114. The preconditioning circuit 204 in this aspect includes a first input coupled to the non-complement output 118 and configured to receive the non-complement output signal 110, and a second input configured to receive the complement output signal 104. In this aspect, the preconditioning circuit 204 is configured to receive the delayed complement output signal 104'.

With continuing reference to FIG. 2, as a non-limiting example, it is assumed that the non-complement input signal 106 has recently transitioned to a logic high ('1') voltage in the first voltage domain (e.g., 0.5 V), and the complement input signal 108 has recently transitioned to a logic low ('0') voltage in the first voltage domain (e.g., 0 V). The second pull-down circuit 122 generates and provides the ground voltage signal to the complement output 114, causing the complement output signal 104 to have a logic low ('0') voltage in the second voltage domain (e.g., 0 V). To increase the rate at which the complement output signal 104 transitions to the logic low ('0') voltage (e.g., 0 V), the preconditioning circuit 204 generates and provides the ground voltage signal to the complement output 114 in response to the non-complement output signal 110 transitioning to a logic high ('1') voltage. In other words, the second pull-up circuit 120 generates and provides the shifted voltage signal to the non-complement output 118 in response to the complement input signal 108 transitioning to a logic low ('0') voltage. In this aspect, while a second NMOS transistor 224 in the preconditioning circuit 204 is still activated prior to the complement output signal 104 transitioning to a logic low ('0') voltage, the shifted voltage signal on the non-complement output signal 110 activates a first NMOS transistor 226, generating the ground voltage signal on the complement output 114. The complement output signal 104 transitions to the logic low ('0') voltage at a faster rate. Therefore, the voltage level shifter 200 may achieve an increased performance as the complement output signal 104 transitions more quickly to the logic low ('0') voltage.

With continuing reference to FIG. 2, in this aspect, the preconditioning circuit 204 is configured to generate the ground voltage signal by employing the first NMOS transistor 226 and the second NMOS transistor 224. A gate (G) of the first NMOS transistor 226 is coupled to the non-complement output 118. A drain (D) of the first NMOS transistor 226 is coupled directly to the complement output 114, and a source (S) of the first NMOS transistor 226 is coupled to a drain (D) of the second NMOS transistor 224. Additionally, a gate (G) of the second NMOS transistor 224 is configured to receive the delayed complement output signal 104', while a source (S) of the second NMOS transistor 224 is coupled to the ground voltage source GND. Notably, other aspects may configure the gate (G) of the second NMOS transistor 224 to receive the complement output signal 104 rather than the delayed complement output signal 104' and achieve similar functionality.

With continuing reference the FIG. 2, similar to the preconditioning circuit 204, the preconditioning circuit 206 is configured to increase the rate at which the non-complement output signal 110 transitions to a logic low ('0') voltage. In this aspect, the preconditioning circuit 206 is configured to generate the ground voltage signal on a preconditioning output of the preconditioning circuit 206 directly coupled to the non-complement output 118. The preconditioning circuit 206 in this aspect includes a first input coupled to the complement output 114 and configured to receive the complement output signal 104, and a second input configured to receive the non-complement output signal 110. In this aspect, the preconditioning circuit 206 is configured to receive the delayed non-complement output signal 110'.

With continuing reference to FIG. 2, as a non-limiting example, it is assumed that the non-complement input signal 106 has recently transitioned to a logic low ('0') voltage in the first voltage domain (e.g., 0 V), and the complement input signal 108 has recently transitioned to a logic high ('1') voltage in the first voltage domain (e.g., 0.5 V). The first pull-down circuit 116 generates and provides the ground voltage signal to the non-complement output 118, causing the non-complement output signal 110 to have a logic low ('0') voltage in the second voltage domain (e.g., 0 V). To increase the rate at which the non-complement output signal 110 transitions to the logic low ('0') voltage (e.g., 0 V), the preconditioning circuit 206 generates and provides the ground voltage signal to the non-complement output 118 in response to the complement output signal 104 transitioning to a logic high ('1') voltage. In other words, the first pull-up circuit 112 generates and provides the shifted voltage signal to the complement output 114 in response to the non-complement input signal 106 transitioning to a logic low ('0') voltage. In this aspect, while a second NMOS transistor 234 in the preconditioning circuit 206 is still activated prior to the non-complement output signal 110 transitioning to a logic low ('0') voltage, the shifted voltage signal on the complement output signal 104 activates a first NMOS transistor 236, generating the ground voltage signal on the non-complement output 118. The non-complement output signal 110 transitions to the logic low ('0') voltage at a faster rate. Therefore, the voltage level shifter 200 may achieve an increased performance as the non-complement output signal 110 transitions more quickly to the logic low ('0') voltage.

With continuing reference to FIG. 2, in this aspect, the preconditioning circuit 206 is configured to generate the ground voltage signal by employing the first NMOS transistor 236 and the second NMOS transistor 234. A gate (G) of the first NMOS transistor 236 is coupled to the complement output 114. A drain (D) of the first NMOS transistor 236 is coupled directly to the non-complement output 118, and a source (S) of the first NMOS transistor 236 is coupled to a drain (D) of the second NMOS transistor 234. Additionally, a gate (G) of the second NMOS transistor 234 is configured to receive the delayed non-complement output signal 110', while a source (S) of the second NMOS transistor 234 is coupled to the ground voltage source GND. Notably, other aspects may configure the gate (G) of the second NMOS transistor 234 to receive the non-complement output signal 110 rather than the delayed non-complement output signal 110' and achieve similar functionality.

In addition to the aspects described with reference to FIGS. 1A, 1B, and 2, FIG. 3 illustrates a process 300 that may be employed by a voltage level shifter, such as the voltage level shifter 200, to transition corresponding complement and non-complement output signals. As a non-limiting example, when the voltage level shifter 200 employs the process 300, the process 300 includes generating a shifted voltage signal of the complement input signal 108 on the first pull-up output coupled to the complement output 114 in response to the non-complement input signal 106 transitioning to a logic low ('0') voltage (block 302). The process 300 also includes generating a ground voltage signal on the first pull-down output coupled to the non-complement output 118 in response to the complement input signal 108 transitioning to a logic high ('1') voltage (block 304). The process 300 also includes generating the shifted voltage signal of the complement input signal 108 on the complement output 114 in response to the non-complement output signal 110 on the non-complement output 118 transitioning to the logic low ('0') voltage without using the complement output signal 104 from the complement output 114 to activate the first pull-down circuit 116 (block 306). In other words, the shifted voltage signal is provided to the complement output signal 104 without feeding the complement output signal 104 back into the first pull-down circuit 116 to reinforce the non-complement output signal 110 to a logic low ('0') voltage so as to activate the first pull-up circuit 112.

Figure 3:
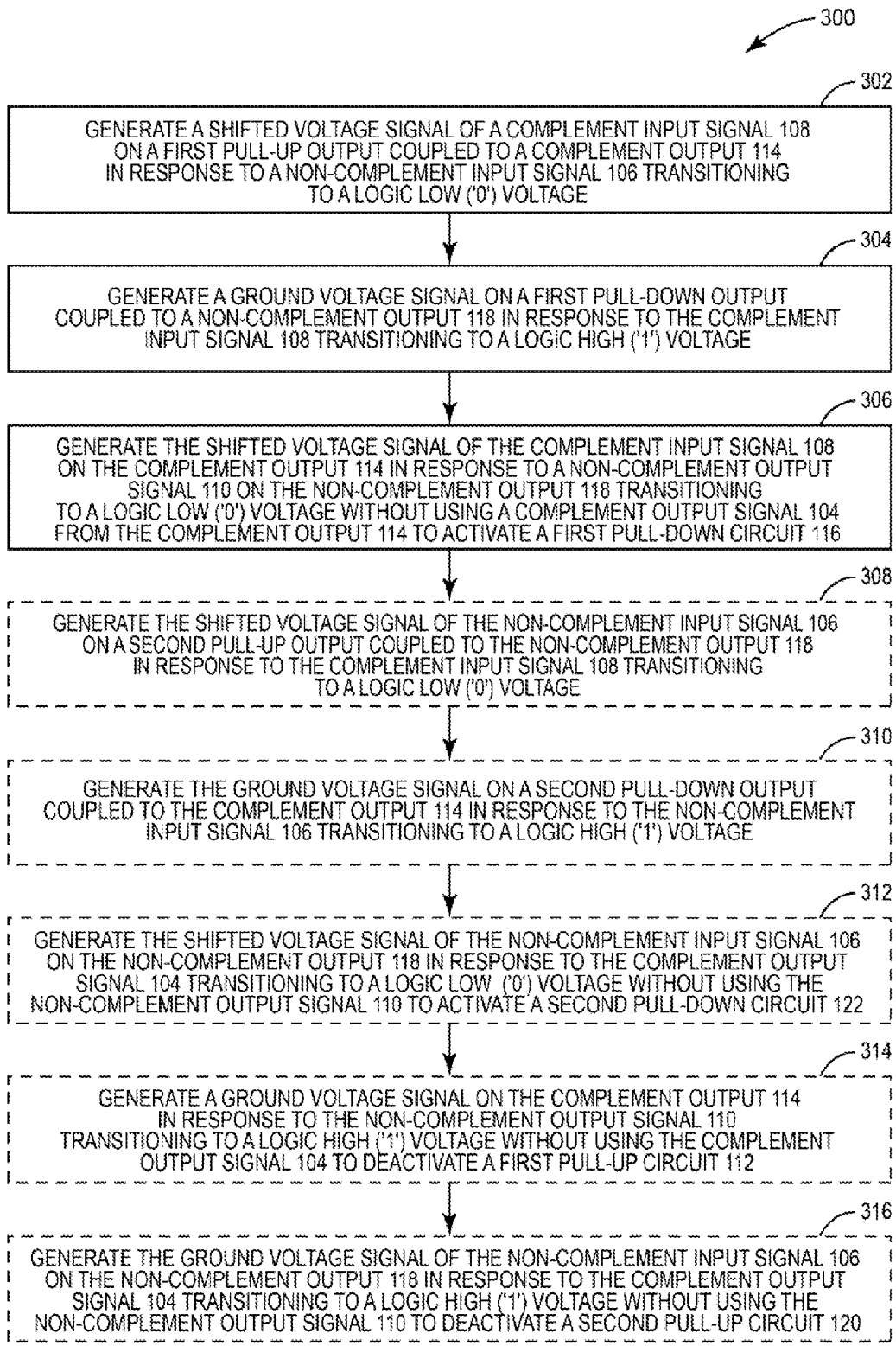
FIG. 3 is a flowchart illustrating an exemplary process of the operation of the voltage level shifter in FIG. 1B.

With continuing reference to FIG. 3, the process 300 may also include generating the shifted voltage signal of the non-complement input signal 106 on the second pull-up output coupled to the non-complement output 118 in response to the complement input signal 108 transitioning to a logic low ('0') voltage (block 308). The process 300 may also include generating the ground voltage signal on the second pull-down output coupled to the complement output 114 in response to the non-complement input signal 106 transitioning to a logic high ('1') voltage (block 310). Further, the process 300 may include generating the shifted voltage signal of the non-complement input signal 106 on the non-complement output 118 in response to the complement output signal 104 transitioning to a logic low ('0') voltage without using the non-complement output signal 110 to activate the second pull-down circuit 122 (block 312). Similar to block 306, the shifted voltage signal is provided to the non-complement output signal 110 without feeding the non-complement output signal 110 back into the second pull-down circuit 122 to reinforce the complement output signal 104 to a logic low ('0') voltage so as to activate the second pull-up circuit 120.

With continuing reference to FIG. 3, the process 300 may also include generating a ground voltage signal on the complement output 114 in response to the non-complement output signal 110 transitioning to a logic high ('1') voltage without using the complement output signal 104 to deactivate the first pull-up circuit 112 (block 314). In other words, the ground voltage signal is provided to the complement output signal 104 without feeding the complement output signal 104 back into the first pull-up circuit 112 to reinforce that the complement output signal 104 is driven by the second pull-down circuit 122. Further, the process 300 may include generating the ground voltage signal of the non-complement input signal 106 on the non-complement output 118 in response to the complement output signal 104 transitioning to a logic high ('1') voltage without using the non-complement output signal 110 to deactivate the second pull-up circuit 120 (block 316). Thus, similar to block 314, the ground voltage signal is provided to the non-complement output signal 110 without feeding the non-complement output signal 110 back into the second pull-up circuit 120 to reinforce that the non-complement output signal 110 is driven by the first pull-down circuit 116.

Notably, the aspects described herein may achieve similar functionality with various values assigned to the supply voltages of the second voltage domain and the first voltage domain. In this manner, some aspects may include a supply voltage in the second voltage domain that is greater than a supply voltage in the first voltage domain. Other aspects may include a supply voltage in the second voltage domain that is equal to a supply voltage in the first voltage domain. Alternative aspects may include a supply voltage in the second voltage domain that is less than a supply voltage in the first voltage domain.

The voltage level shifters configured to increase output transition rates to increase performance according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 4:
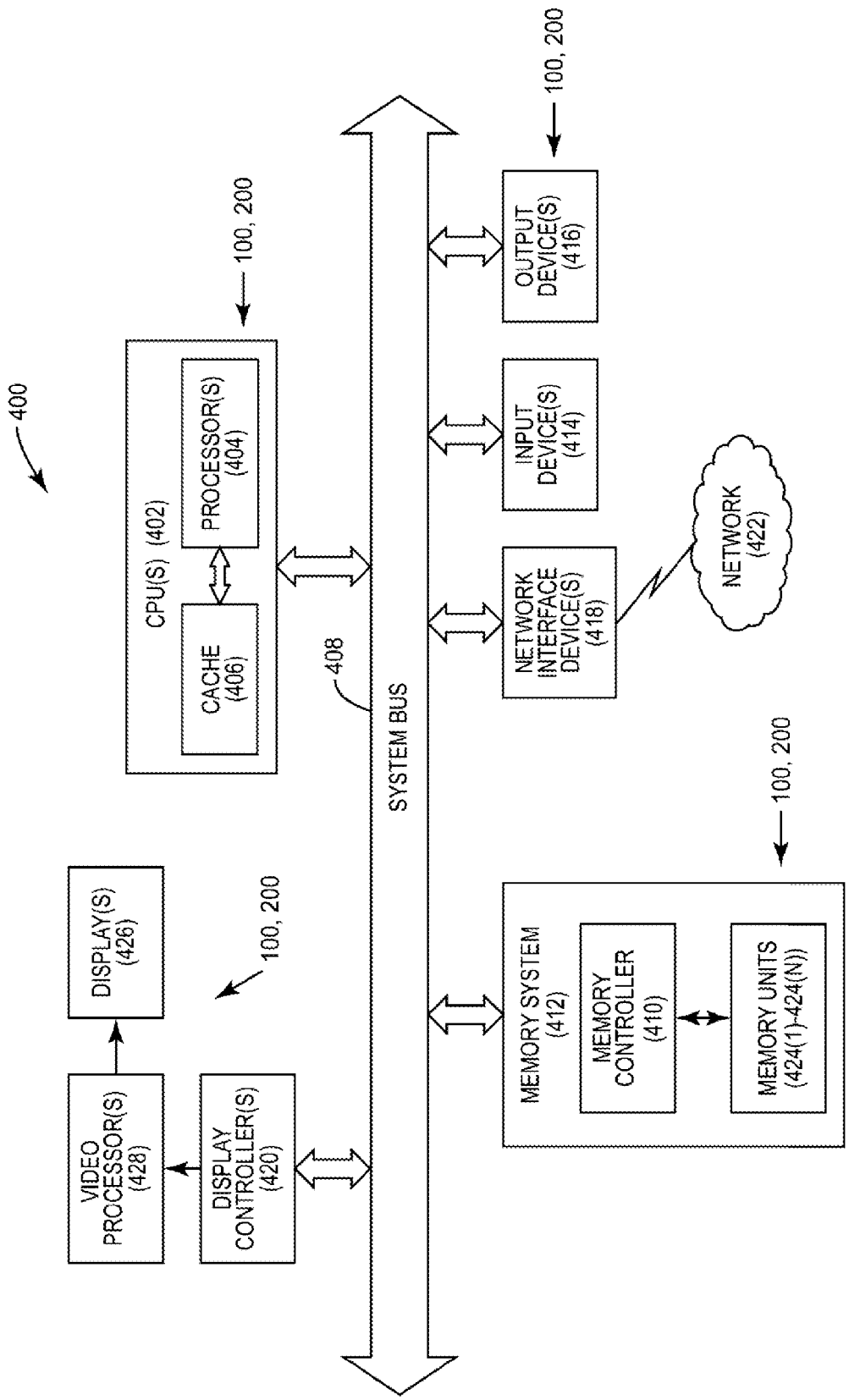
FIG. 4 is a block diagram of an exemplary processor-based system that can include the voltage level shifters configured to transition the outputs more quickly, such as the aspects of FIGS. 1A, 1B, and 2.

In this regard, FIG. 4 illustrates an example of a processor-based system 400 that can employ the voltage level shifters 100, 200 configured to precondition outputs to increase performance illustrated in FIGS. 1A, 1B, and 2. Notably, the voltage level shifters 100, 200 may be employed by any component included in the processor-based system 400. In this example, the processor-based system 400 includes one or more central processing units (CPUs) 402, each including one or more processors 404. The CPU(s) 402 may have cache memory 406 coupled to the processor(s) 404 for rapid access to temporarily stored data. The CPU(s) 402 is coupled to a system bus 408 and can intercouple master and slave devices included in the processor-based system 400. As is well known, the CPU(s) 402 communicates with these other devices by exchanging address, control, and data information over the system bus 408. For example, the CPU(s) 402 can communicate bus transaction requests to a memory controller 410 as an example of a slave device. Although not illustrated in FIG. 4, multiple system buses 408 could be provided, wherein each system bus 408 constitutes a different fabric.

Other master and slave devices can be connected to the system bus 408. As illustrated in FIG. 4, these devices can include a memory system 412, one or more input devices 414, one or more output devices 416, one or more network interface devices 418, and one or more display controllers 420, as examples. The input device(s) 414 can include any type of input device, including but not limited to input keys, switches, voice processors, etc. The output device(s) 416 can include any type of output device, including but not limited to audio, video, other visual indicators, etc. The network interface device(s) 418 can be any device configured to allow exchange of data to and from a network 422. The network 422 can be any type of network, including but not limited to a wired or wireless network, a private or public network, a local area network (LAN), a wide local area network (WLAN), or the Internet. The network interface device(s) 418 can be configured to support any type of communications protocol desired. The memory system 412 can include one or more memory units 424(0)-424(N).

The CPU(s) 402 may also be configured to access the display controller(s) 420 over the system bus 408 to control information sent to one or more displays 426. The display controller(s) 420 sends information to the display(s) 426 to be displayed via one or more video processors 428, which process the information to be displayed into a format suitable for the display(s) 426. The display(s) 426 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A voltage level shifter, comprising:
   a first pull-up circuit, comprising:
      a first input configured to receive a non-complement input signal; and
      a second input configured to receive a non-complement output signal;
      the first pull-up circuit configured to generate a complement output signal on a first pull-up output coupled to a complement output;
   a first pull-down circuit, comprising:
      a first input configured to receive a complement input signal;
      the first pull-down circuit configured to generate the non-complement output signal comprising a ground voltage signal on a first pull-down output coupled to a non-complement output;
   a first preconditioning circuit, comprising:
      a first input configured to receive the non-complement output signal; and
      a second input configured to receive the complement output signal;
      the first preconditioning circuit configured to generate a shifted voltage signal of the complement input signal on a first preconditioning output directly coupled to the complement output in response to the non-complement output signal transitioning to a logic low voltage; and
   a second preconditioning circuit, comprising:
      a first input configured to receive the complement output signal; and
      a second input configured to receive the non-complement output signal;
      the second preconditioning circuit configured to generate the ground voltage signal on a second preconditioning output directly coupled to the non-complement output in response to the complement output signal transitioning to a logic high voltage.

2. The voltage level shifter of claim 1, wherein the second input of the first preconditioning circuit is coupled to a delay output of a delay circuit, wherein an input of the delay circuit is coupled to the complement output.

3. The voltage level shifter of claim 1, further comprising:
a second pull-up circuit, comprising:
a first input configured to receive the complement input signal; and
a second input configured to receive the complement output signal;
the second pull-up circuit configured to generate the non-complement output signal on a second pull-up output coupled to the non-complement output; and
a second pull-down circuit, comprising:
a first input configured to receive the non-complement input signal;
the second pull-down circuit configured to generate the complement output signal comprising the ground voltage signal on a second pull-down output coupled to the complement output.

4. The voltage level shifter of claim 3, wherein the first pull-up circuit further comprises:
a first p-type metal-oxide semiconductor (PMOS) transistor, comprising:
a gate configured to receive the non-complement input signal;
a drain coupled to the first pull-up output; and
a source; and
a second PMOS transistor, comprising:
a gate coupled to the non-complement output;
a source coupled to a voltage supply; and
a drain coupled to the source of the first PMOS transistor.

5. The voltage level shifter of claim 4, wherein the first pull-down circuit further comprises an n-type metal-oxide semiconductor (NMOS) transistor, comprising:
a gate configured to receive the complement input signal;
a drain coupled to the first pull-down output; and
a source coupled to a ground voltage source.

6. The voltage level shifter of claim 5, wherein the first preconditioning circuit further comprises:
a first PMOS transistor, comprising:
a source coupled to the voltage supply;
a gate coupled to the non-complement output; and
a drain; and
a second PMOS transistor, comprising:
a gate configured to receive the complement output signal;
a source coupled to the drain of the first PMOS transistor of the first preconditioning circuit; and
a drain coupled to the first preconditioning output.

7. The voltage level shifter of claim 6, wherein the second pull-up circuit further comprises:
a first PMOS transistor, comprising:
a gate configured to receive the complement input signal;
a drain coupled to the second pull-up output; and
a source; and
a second PMOS transistor, comprising:
a gate coupled to the complement output;
a source coupled to the voltage supply; and
a drain coupled to the source of the first PMOS transistor of the second pull-up circuit.

8. The voltage level shifter of claim 7, wherein the second pull-down circuit further comprises an NMOS transistor, comprising:
a gate configured to receive the non-complement input signal;
a drain coupled to the second pull-down output; and
a source coupled to the ground voltage source.

9. The voltage level shifter of claim 8, wherein the first PMOS transistor and the second PMOS transistor of the second pull-up circuit are each configured to have a longer gate length than a gate length of the NMOS transistor of the first pull-down circuit.

10. The voltage level shifter of claim 8, wherein the first PMOS transistor and the second PMOS transistor of the second pull-up circuit are each configured to have a shorter gate width than a gate width of the NMOS transistor of the first pull-down circuit.

11. The voltage level shifter of claim 8, wherein the first PMOS transistor and the second PMOS transistor of the second pull-up circuit are each configured to have a higher threshold voltage than a threshold voltage of the NMOS transistor of the first pull-down circuit.

12. The voltage level shifter of claim 8, wherein the first PMOS transistor and the second PMOS transistor of the first pull-up circuit are each configured to have a longer gate length than a gate length of the NMOS transistor of the second pull-down circuit.

13. The voltage level shifter of claim 8, wherein the first PMOS transistor and the second PMOS transistor of the first pull-up circuit are each configured to have a shorter gate width than a gate width of the NMOS transistor of the second pull-down circuit.

14. The voltage level shifter of claim 8, wherein the first PMOS transistor and the second PMOS transistor of the first pull-up circuit are each configured to have a higher threshold voltage than a threshold voltage of the NMOS transistor of the second pull-down circuit.

15. The voltage level shifter of claim 8, wherein the first PMOS transistor and the second PMOS transistor of the first preconditioning circuit are each configured to have a shorter gate length than a gate length of the first PMOS transistor and the second PMOS transistor of the first pull-up circuit.

16. The voltage level shifter of claim 8, wherein the first PMOS transistor and the second PMOS transistor of the first preconditioning circuit are each configured to have a longer gate width than a gate width of the first PMOS transistor and the second PMOS transistor of the first pull-up circuit.

17. The voltage level shifter of claim 8, wherein the first PMOS transistor and the second PMOS transistor of the first preconditioning circuit are each configured to have a lower threshold voltage than a threshold voltage of the first PMOS transistor and the second PMOS transistor of the first pull-up circuit.

18. The voltage level shifter of claim 3, further comprising:
a third preconditioning circuit, comprising:
a first input configured to receive the non-complement output signal originating from the non-complement output; and
a second input configured to receive the complement output;
the third preconditioning circuit configured to generate a shifted voltage signal of the non-complement input signal on a third preconditioning output directly coupled to the non-complement output in response to the complement output signal transitioning to a logic low voltage.

19. The voltage level shifter of claim 18, further comprising:
- a fourth preconditioning circuit, comprising:
  - a first input configured to receive the non-complement output signal; and
  - a second input configured to receive the complement output signal;
  - the fourth preconditioning circuit configured to generate the ground voltage signal on a fourth preconditioning output directly coupled to the complement output in response to the non-complement output signal transitioning to a logic high voltage.

20. The voltage level shifter of claim 19, wherein the fourth preconditioning circuit further comprises:
- a first n-type metal-oxide semiconductor (NMOS) transistor, comprising:
  - a gate coupled to the non-complement output;
  - a drain coupled to the complement output; and
  - a source; and
- a second NMOS transistor, comprising:
  - a gate configured to receive the complement output signal;
  - a source coupled to a ground voltage source; and
  - a drain coupled to the source of the first NMOS transistor.

21. The voltage level shifter of claim 1 integrated into an integrated circuit (IC).

22. The voltage level shifter of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

23. A voltage level shifter, comprising:
- a means for generating a complement output signal on a first pull-up output coupled to a complement output in response to a non-complement input signal transitioning to a logic low voltage;
- a means for generating a non-complement output signal comprising a ground voltage signal on a first pull-down output coupled to a non-complement output in response to a complement input signal transitioning to a logic high voltage;
- a means for generating a shifted voltage signal of the complement input signal on a first preconditioning output directly coupled to the complement output in response to the non-complement output signal on the non-complement output transitioning to a logic low voltage; and
- a means for generating the ground voltage signal on a second preconditioning output directly coupled to the non-complement output in response to the complement output signal transitioning to a logic high voltage.

24. A method for increasing an output transition rate of a voltage level shifter, comprising:
- generating a shifted voltage signal of a complement input signal on a first pull-up output of a first pull-up circuit coupled to a complement output in response to a non-complement input signal transitioning to a logic low voltage;
- generating a ground voltage signal on a first pull-down output of a first pull-down circuit coupled to a non-complement output in response to the complement input signal transitioning to a logic high voltage;
- generating the shifted voltage signal of the complement input signal on a first preconditioning output directly coupled to the complement output in response to a non-complement output signal on the non-complement output transitioning to a logic low voltage; and
- generating the ground voltage signal on a second preconditioning output directly coupled to the non-complement output in response to a complement output signal transitioning to a logic high voltage.

25. The method of claim 24, further comprising:
- generating a shifted voltage signal of the non-complement input signal on a second pull-up output of a second pull-up circuit coupled to the non-complement output in response to the complement input signal transitioning to a logic low voltage; and
- generating the ground voltage signal on a second pull-down output of a second pull-down circuit coupled to the complement output in response to the non-complement input signal transitioning to a logic high voltage.

26. The method of claim 25, further comprising generating the shifted voltage signal of the non-complement input signal on a third preconditioning output directly coupled to the non-complement output in response to the complement output signal transitioning to a logic low voltage.

27. The method of claim 26, further comprising generating the ground voltage signal on a fourth preconditioning output directly coupled to the complement output in response to the non-complement output signal transitioning to a logic high voltage.

* * * * *